United States Patent [19]

Denz et al.

[11] Patent Number: 4,879,968
[45] Date of Patent: Nov. 14, 1989

[54] SEPARATING DEVICE FOR TRIMMING THE WIDTH OF A POURED CURTAIN OF COATING MATERIAL

[75] Inventors: Martin Denz; Diethard Kapp-Schwoerer, both of Basel, Switzerland

[73] Assignee: Ciba-Geigy Corporation, Ardsley, N.Y.

[21] Appl. No.: 159,982

[22] Filed: Feb. 24, 1988

[30] Foreign Application Priority Data

Mar. 3, 1987 [CH] Switzerland .............................. 792/87

[51] Int. Cl.$^4$ ................................................ B05D 1/30
[52] U.S. Cl. ..................................... 118/300; 427/420; 118/DIG. 4
[58] Field of Search .......... 427/420; 118/300, DIG. 4

[56] References Cited

U.S. PATENT DOCUMENTS

| | | | |
|---|---|---|---|
| 3,345,972 | 10/1967 | Masulis | 118/DIG. 4 |
| 3,434,457 | 3/1969 | Bass | 118/DIG. 4 |
| 4,060,649 | 11/1977 | Coleman | 118/DIG. 4 |
| 4,060,699 | 11/1977 | Ataka et al. | 179/18 GF |
| 4,230,793 | 10/1980 | Losert et al. | 430/315 |
| 4,559,896 | 12/1985 | Bossard et al. | 118/300 |

FOREIGN PATENT DOCUMENTS 2580199 10/1986 France .

272844 1/1968 U.S.S.R. .......................... 118/DIG. 4

Primary Examiner—Shrive Beck
Attorney, Agent, or Firm—Harry Falber

[57] ABSTRACT

A severing organ for trimming the width of a curtain of coating material poured onto an impingement site on a substrate, in particular a printed circuit board, to be coated and being moved at a distance below the foot end of the severing organ transverse to the direction of the flow of the curtain consists of a single separating element whose upper end is designed as a knifelike sharp severing edge. The side of the separating element turned toward the central region of the poured curtain is an uninterrupted, smooth wall surface which extends in only one plane from the severing edge in the direction toward the foot end of the separating element, forming a lower foot-end edge therewith, and has an inclination relative to the perpendicular which can be so adjusted that the trimmed central region of the poured curtain flows laminarly downward being laterally widened along the inner wall surface to become detached at the lower foot-end edge, and impinges directly with nearly the same widening onto the substrate to be coated, whereby a coating layer is deposited on the substrate with formation of only a narrow marginal bead having at most twice the height of the still undried layer on the substrate.

9 Claims, 2 Drawing Sheets

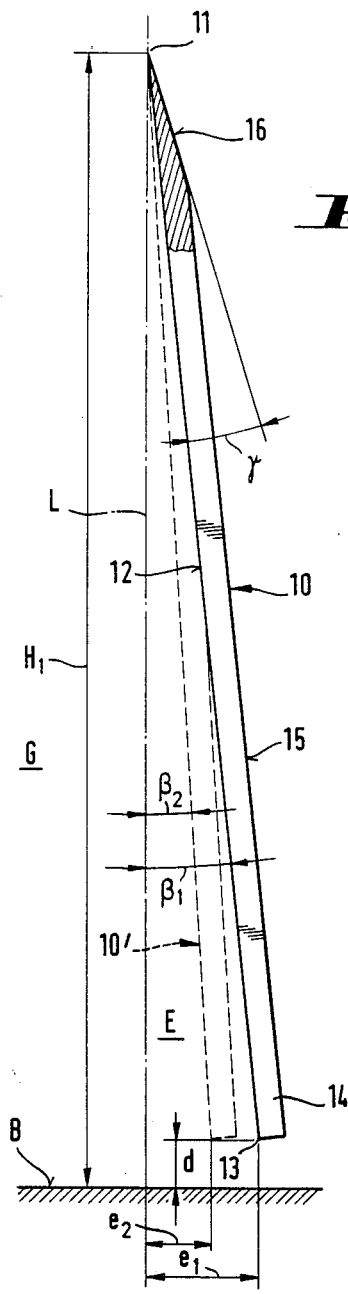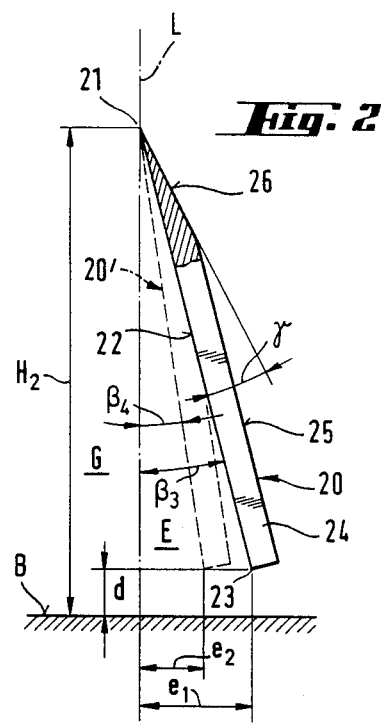

SEPARATING DEVICE FOR TRIMMING THE WIDTH OF A POURED CURTAIN OF COATING MATERIAL

BACKGROUND OF THE INVENTION

This invention relates to a separating device for trimming the width of a poured curtain of coating material in a coating device, and more particularly prior to the curtain's impinging on a substrate, in particular a printed circuit board, to be coated which substrate is passed transverse to the direction of curtain flow underneath a foot end of the separating device at a distance from the latter while the separating device is inclined, relative to the perpendicular, at an angle such that the upper end of the separating device projects beyond the foot end of the same in a direction toward the central region of the curtain and projects separatingly into a lateral region of the curtain, so that a marginal strip of the curtain is separated from the central region thereof and the coating material of that strip is diverted laterally, while the trimmed central region of the poured curtain is enlarged downwardly being spread laterally toward the separating device.

Severing organs of this kind have been disclosed more recently for use in trimming devices of coating apparatus described, for instance, in U.S. Pat. No. 4,559,896 to Bossard et al and in published European patent application Ser. No. 145,648. The severing organs described therein of which usually one is provided for trimming the left-hand margin and another one for trimming the right-hand margin of a poured curtain of coating material comprise each a first, upper separating element which projects with its upper end into the poured curtain and trims the width of a curtain while having a guiding edge at its lower end and simultaneously leading off laterally the coating material of the severed marginal curtain region, as will as a second separating element below the first one and being laterally, slightly inwardly staggered, which second separating element narrows the width of the poured curtain further by trimming a marginal zone thereof which could lead to the formation of an intermediary rim bead. This lateral curtain edge guide can comprise a lower segment which is either inclined downwardly inwardly, i.e. toward the middle region of the curtain whereby a reduction of the width of this curtain middle region will be effected, or it is inclined downwardly outwardly, therefore achieving a slight widening or "spreading" of the curtain accompanied by a corresponding reduction of its thickness. Moreover, the lateral guidance of the marginal region of the trimmed curtain middle region can comprise an upper segment which is inclined outwardly in downward direction, and, associated with that segment in downward direction, a second slightly inwardly inclined segment.

The outwardly inclined upper segment of this known severing organ can enclose, with the perpendicular, an angle $\beta$ of preferably up to 5° while a segment provided downwardly of the first segment and being inwardly inclined preferably encloses, with the perpendicular, an angle $\alpha$ from 1 to 8° which is shown to be considerably larger than the angle $\beta$ as shown in FIG. 4 of U.S. Pat. No. 4,559,896.

Trimming of a curtain of coating material and in particular of the type of coating material which is used in the coating of printed circuit plates, is required because of the formation of marginal beads which occurs as the curtain descends and is being deposited onto the moving substrate and carried along on the latter. Such bead formation does not occur with any comparable disturbing effect if the descending curtain consists of water. Devices for controlling the width of a water curtain have been described in French patent application Ser. No. 85,05634 by IRSID, published as No. 2,580,199 on Oct. 17, 1986.

The particular phenomenon occurring when coating materials for the above purpose are involved is noticeable already in the descending curtain not having a constant curtain thickness across its entire width. Along the lateral curtain rim guiding elements which are always required a pronounced marginal bead is unavoidably formed which extends by a shorter or longer distance into the central curtain region depending on the rheological properties of the coating material. The width of this marginal bead zone amounts on each of the two longitudinal curtain rims and correspondingly along the longitudinal rims of the coating zone or strip being deposited on the substrate being coated, to about 5 to 20 mm. The height of the marginal bead protruding above the deposited coating can be as much as 1 to 2 mm. When manufacturing electronic circuit plates, e.g. for electronic apparatus which require circuit plates in which a marginal zone about the plate top or bottom face is to remain uncoated and which are to contain numerous extremely thin conducting lines, the formation of such beads, for instance, when a coating is applied as solder-stopping shields or masks, is most disturbing or even completely inadmissible. Further processing of such plates having marginal beads in their coating or coated regions can be made very difficult.

In U.S. Pat. No. 4,060,649 to Coleman, guide plates have been described which are provided at either edge of a curtain of paint being applied to a substrate. It had been noted that the resulting paint coatings were uneven because the curtain tended to draw together or at least to wrinkle. The inner edges of the guide plates to which the paint curtain edges cling by capillarity must be sloped inwardly, as had been suggested for the lowermost guiding segment shown, for instance, in FIGS. 3 and 4 of U.S. Pat. No. 4,559,896, supra.

It has been found that guiding elements of the type described in U.S. Pat. Nos. 4,060,649 and 4,559,896 do not suppres the undesirable formation of marginal beads or reduce the height and width of the bead zones only to an unsatisfactory degree.

To the extent that such reduction is achieved especially by some of the trimming devices described in U.S. Pat. No. 4,559,896, the achieved reduction of the size of the marginal beads has been rendered insufficient by the rapid advances in the field of printed circuit plate technology. For, it is nowadays no longer sufficient to keep the marginal zones at the opposite longitudinal edges of the plates free from being coated by the poured curtain impinging on the plates as they advance through the coating apparatus at substantially even speed, but the coating being applied, in particular, as a solder-stopping mask is often to cover only certain selected areas of the circuit plate; and in this case marginal beads about such areas are particularly undesirable.

Thus it had been found that coatings produced with the coating apparatus of U.S. Pat. No. 4,559,896 (or the corresponding EP-A-0 145,648) still contain marginal beads which, when the thickness of the applied coating layer after drying is about 30 micrometers (mcm), will extend over a marginal zone having a width of about 10 to 20 mm, which corresponds to a reduction of the width of the usable circuit plate area by about 20 to 40 mm, taking both opposite marginal zones into account; and this does not take into account losses of usable area occurring in the internal area of the circuit plate when only parts of that area are to be covered by solder-stopping masks. The marginal beads often occurred as double beads of which the outer bead can attain up to 110 mcm and the inner bead a height of 70 mcm when the coating is to serve as solderstopping mask was applied by the coating process using the solution described in column 3, line 62 till column 4, line 7, of U.S. Pat. No. 4,230,793 (corresponding to European patent 2040), when a curtain of the solution having a thickness of about 40 mcm is poured with a speed of 90 meters per minute onto a printed circuit plate moved transversely thereto at approximately the same speed, thereby producing a coating having undried a weight of about 7.5 g per 600 $cm^2$ of circuit area. The thickness of the coating after drying, applied under the abovedescribed conditions and using the above-mentioned solution as coating material, amounts to about 25 to 35, and preferably about 28 to 30 mcm.

OBJECTS AND SUMMARY OF THE INVENTION

It is therefore a first object of the invention to provide a separating device of the initially-described type which considerably simplifies the relatively lavish, somewhat more expensive construction requiring two separating elements in each of the two severing organs used in the known device of U.S. Pat. No. 4,559,896, and which nevertheless affords substantially narrower, less high beads than are produced with the last-mentioned known severing organs.

It is another object of the invention to provide means for maintaining a purely laminary flow of the coating material not only in the middle curtain zone but also in the laterally spread, extended side region or regions E thereof and thus to contribute to keeping any marginal beads that might still occur narrower and lower than it is possible to achieve with the known severing organs.

These objects and others that will be apparent from the following description are attained in accordance with the invention by a separating device of the initially-described type in which the device consists of a single separating element whose upper end is designed as a knifelike, sharp severing edge and whose inner wall surface facing toward the central region of the curtain being poured constitutes an uninterrupted, smooth face extending in a single plane from the said severing edge to a lower foot-end edge at the foot end of the separating element, while the inclination of the aforesaid inner wall surface relative to the perpendicular is adjustable in a manner such that the trimmed central region of the poured curtain flows downward with laminar flow and with lateral spreading along the aforesaid inner wall surface and is severed from that surface at the said lower foot-end edge, whereby it can impinge with almost the same lateral spreading onto a substrate to be coated in a horizontal coating plane extending transversely to the poured curtain, thereby depositing a coating layer, any marginal bead of which layer being formed therein is narrow and is at most twice as high above the coating plane as the bead-free regions of the still undried layer.

A coating is "undried" when freshly deposited on a substrate by the curtain and still containing a major portion of the solvent present in the solution mentioned hereinbefore as coating material. The width and height of marginal beads occurring in coated zones on a substrate can be reduced more when using separating elements according to the invention bearing one or preferably several of the following inventive features:

The smooth inner wall surface of the separating element is of shorter length, and the lower foot-end edge thereof hence less distant from the severing edge thereof, than if the separating element were of such length that the central curtain region, flowing downward with the spreading portion thereof remaining laterally in contact with said inner wall surface due to adhesive forces acting between the material of the curtain, on the one hand, and that of the inner wall surface, on the other hand would become detached from the latter only as the inherent weight of the adhering curtain overcomes the said adhesive forces.

The inclination of the inner wall surface of the separating element relative to the perpendicular is adjusted in a manner such that the lower foot-end edge is at a distance of about 3 to 8 mm from the perpendicular, which distance is measured in a plane extending through the said foot-end edge parallel with the coating plane mentioned further above.

The inclination of the smooth inner wall surface relative the perpendicular amounts to about 3° to 25°, and preferably to from 5.5° to 15°.

The length of the smooth inner wall surface from the upper sharp severing edge to the lower foot-end edge amounts to about 10 to 500 mm and preferably from 30 to 70 mm.

The upper severing edge is rendered knifelike, sharp by means of an oblique face provided at the upper end of that wall surface of the separating element facing away from the curtain central region, which oblique face encloses with the smooth inner wall surface of the separating element an acute angle.

The smooth inner wall surface of the separating element can be plated with a noble metal such as silver, gold or a metal of the platinum group in order to enhance adhesive forces with the coating material.

BRIEF DESCRIPTION OF THE DRAWINGS

Further details of the invention will become apparent from the following description thereof in connection with the accompanying drawings in which FIG. 1 is a schematic sideview of a first embodiment of the separating element according to the invention, partially in longitudinal section;

FIG. 2 is a similar view of a second embodiment, and

DETAILED DESCRIPTION OF THE EMBODIMENTS SHOWN IN THE DRAWINGS

Figure 3:
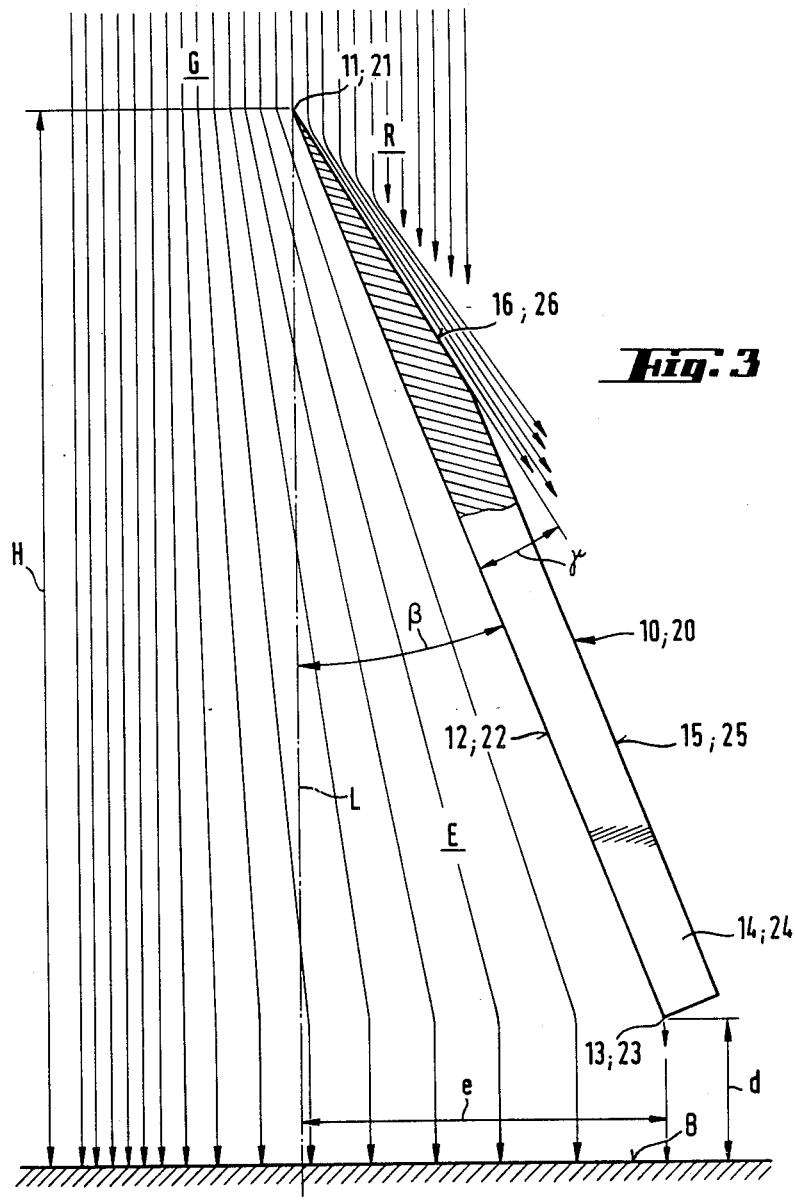
FIG. 3 is a greatly enlarged sideview of the region of the severing edge at the upper end of the separating element according to the invention, with flowlines indicating the flow of the coating material.

The separating element 10 according to the invention which is shown in FIG. 1 and which is several times larger than the scale on which the element would be built in practice, has at its upper end a knifelike sharp severing edge 11 whose height $H_1-0$ perpendicularly above the coating plane B can, for instance, be 70 mm in a manufactured sample of the separating element. This embodiment as well as that of FIG. 2 are represented on a several-times enlarged scale.

The inner surface facing toward the middle of the curtain, of the separating element 10, is a single uninterrupted, smooth planar face 12 which extends from the severing edge 11 to a lower end edge of the foot end 14 of the separating element 10. The foot end edge 13 is located above and distanced by about 3 to 4 mm from the coating plane B. The severing edge 11 is produced by providing at the upper end of the separating element 10 on its rearside 15 which faces away from the curtain central region, an oblique face 16 sharpening the edge 11, which oblique face 16 can, for instance, be produced by fine grinding. The separating element 10 is therefore preferably made from a chromium nickel steel such as, e.g., V₂A-steel.

The desired reduction of the width and height of any marginal beads being formed in the coating deposited on the substrate is achieved by a lateral widening or "spreading" of the central region of the poured curtain G. This spreading E should amount to about 3 to 9 mm, and preferably to 4 to 7 mm measured in the plane which extends through the foot end edge 13 extending parallel with the coating plane B.

In the position of the separating element which is shown in fully drawn lines in FIG. 1, the distance of the foot-end edge 13 from the perpendicular, taken in the mentioned parallel plane, is 7 mm. To this end, the smooth wall surface 12 of the separating element 10 must enclose with the perpendicular L, at the severing edge 11, an angle $\beta$ of 5.5°.

When a spreading width E of 4 mm is sufficient to attain the above-mentioned goal, and this depends largely on the rheological properties of the coating material of the curtain, then the above-mentioned angle $\beta$ will only be 3.5°. However, an indispensable condition for attaining the desired objects stated hereinbefore demands that the severing edge 11 be as sharp as possible and that the smooth wall surface 12 be completely free from any unevenness which might produce local turbulences in the downwardly flowing and widening lateral extension or extensions E of the curtain G as it flows downward along the inclined wall surface 12. The above-mentioned position of the separating element 10 in which the wall surface 12 encloses with the perpendicular L an angle of only 3.5° is shown in dashed outline in FIG. 1.

The same result of a desired lateral enlargement E of the central curtain region by about 3 to 8 mm can also be achieved with a considerably shorter separating element 20 whose inner wall surface 22 has a length of, for instance, only 28 mm, when this separating element is sufficiently inclined to enclose with the perpendicular L an angle of 14.5° or 8.5° and when the height $H_2-0$ of its severing edge 21 above the coating plane B is only 30 mm. The position in which the separating element 20 has an inclination of 14.5° is shown in fully drawn-out lines in FIG. 2, and the distance of its lower foot end edge 23 from the coating plane B is again 3 mm. This is also the case in the position to which the separating organ 20' is adjusted and in which it is shown in dashed lines in FIG. 2. In the case of the separating member 20 the distance $e_1$ of the lower foot end edge 23 from the perpendicular amounts to 7 mm, while in the case of the separating member 20' the corresponding distance $e_2$ is only 4 mm.

It will be clear from the foregoing that the severing organ according to the invention, constituting a single separating element, can be manufactured to have a length varying over a wide range, for instance from 20 to 80 mm. so that it is easy to adapt the dimensions of the separating element to those required for fitting the same into an apparatus of known type and of given dimensions. The capability of adjusting the angle $\beta$ at which the separating element according to the invention is inclined with respect to the perpendicular L is achieved by suitably designed, known installations in the coating apparatus and permits adaptation to different coating materials showing different adhesive strengths in contact with the material constituting the inner wall surface 12 of the separating element 10, which material can be a suitable metal such as, in particular, a stainless steel, or a synthetic material of sufficient hardness to permit the formation of a knifelike sharp severing edge 11.

In FIG. 3 there are shown schematically the conditions of coating material flow which prevail in the region of the curtain where a marginal zone is parted from the curtain central zone by the upper edge 11 of the separating element 10. In this FIG., the upper end portion of the separating element which comprises the sharp severing edge 11 is shown on a considerably enlarged scale. The angle of inclination $\beta$ between the inner wall surface 12 and the perpendicular L amounts to 22°, whereby a desired spreading E of the curtain central region is achievwhich amounts to 8 mm. This widening is illustrated by the distance e and is already attained when the height of the severing edge 11 above the coating plane B (not shown in FIG. 3) is only about 23 to 24 mm.

Preferably, the length of the smooth wall surface 11, 21 is somewhat shorter than it would have to be if, at its lower end region, the widened curtain would become detached, before reaching the lower foot end edge 13, 23 due to the inherent weight of the curtain overcoming the adhesive forces holding the curtain material in contact with the smooth wall surface of separating element 10, 20.

On the rear face 15, 25 of the separating element 10, 20 which face is turned away from the central curtain region, there are provided in a conventionalmanner discharging means such as, for instance, an inclined guiding trough or chute which serves to lead the trimmed-off curtain material R laterally away from the downwardly continuing central curtain region G. Such discharging means have been illustrated, for instance, in FIG. 1 of U.S. Pat. No. 4,559,896 in which they have been designated by reference numerals 12 and 22. In order to avoid all turbulences at the severing edge 11, 21 of the separating element 10, 20, the discharging means should be attached to the rearward face 15, 25 of the separating element spaced by a distance of at least 10 mm from the severing edge 11, 21 downwardly, so that there is no risk of backward build-up of curtain material in the chute up to and beyond the severing edge which build-up would disturb the laminar flow of the curtain material ahead of and on both flanks of the severing edge, causing whirling in the flow.

For the same reason, the oblique surface 16, 26 which serves to form the sharp severing edge 11, 21 is provided at the rearwardly facing wall surface 15, 25, and not on the smooth inner wall surface 12, 22 of the separating element 10, 20 as is the blade 11 illustrated in FIG. 1 of U.S. Pat. No. 4,559,896.

When using the coating apparatus as described in the lastmentioned U.S. Pat. No., but replacing the severing organs described therein (with blades 11 in FIG. 1 of the patent), to the right and to the left of the poured curtain central region by a single separating element according to the invention on each side of the curtain, and each of these elements has an inner wall surface having a length of 59 mm, substrates of equal size were coated under equal conditions and with the same solutions for forming solder-stopping masks to obtain coatings having a dry thickness of 28 to 30 mcm. However, while the marginal beads in the coatings obtained with the severing organs shown in FIG. 1 of U.S. Pat. No. 4,559,896 had the height mentioned hereinbefore of about 110 mcm and the width of the two ridges formed of about 10 to 20 mm, there was only a single marginal ridge formed when using the separating elements 10 according to the invention, and the height of the ridge was only 52 mcm (above the coating plane B) and the width of the single ridge was only about 2 mm along each longitudinal margin of an applied coating or coated area. The loss of circuit-containing area left on the subtrate due to the formation of beads or ridges was therefore only about one fifth of the loss occurring when using the last mentioned known coating apparatus having the severing organs, each comprising two separating elements on each side of the poured curtain to be trimmed.

The level of the severing edge 11, 21 of the separating element 10, 20 above the coating plane B amounted in the abovementioned example according to the invention to 65 mm and the angle of inclination of the inner wall surface 11, 21 with the perpendicular was about 4.5° to 6°.

A further advantage of using separating elements according to the invention in coating apparatus of known construction resides in a considerable saving of expensive coating material.

The cross-sectional diameter of the separating elements 10, 20 is represented in the drawing as considerably greater than in practice. Thus, a thickness of a separating element made for instance, of V₂A steel having a cross-sectional diameter, between the inner and the rearward wall surfaces 12, 22 and 15, 25 respectively, would be satisfactory, when being 0.5 to 1 mm.

A further decrease of the width and height of marginal beads or ridges occurring when coating printed circuit boards or the like on a substrate along the longitudinal edges of the central region, cut out by trimming the poured curtain laterally in a coating apparatus of known type, but equipped with separating elements according to the invention, or smaller partial regions on a substrate, is achieved when the smooth inner wall surface 12, 22 of the separating element is plated with a thin layer of a noble metal such as gold, silver or a metal of the platinum group.

We claim:

1. In a coating apparatus for pouring a curtain of coating material moving downwardly on to a substrate, moving transverse to the direction of movement of the curtain, and impinging on the substrate in a coating plane, with said curtain forming a coating layer, on said substrate, having marginal beads formed therein parallel with the direction of movement of said substrate, and a severing organ associated with at least one side of said curtain and having a foot end and an upper end thereof and being inclined with regard to the perpendicular with said foot end farther from the central region of said curtain than said upper end, said severing organ being adapted to trim the width of said curtain prior to the impingement thereof on said substrate in said coating plane extending at a short distance below said foot end, said upper severing organ end protruding into said curtain in a manner such that a marginal region of said curtain is severed from said central region thereof, and a cut-off portion of coating material constituting said marginal region is diverted laterally while the trimmed central region of said curtain adheres over a part of its downward travel to said severing organ thereby being spread and downwardly widened prior to impinging on said substrate, the improvement of said severing organ consisting essentially of a one-piece separating element comprising
- an upper end being designed as a knifelike, sharp severing edge,
- said foot end having a lower foot-end edge when said separating element is in said inclined condition,
- an inner wall surface destined for facing toward said central curtain region and having a smooth, uninterrupted face extending in only one plane from said severing edge to said lower foot end edge at said foot end,
- a rear wall surface facing away from said central curtain region having an oblique face provided at the upper end thereof and enclosing with said smooth inner wall surface an acute angle, thereby rendering said upper severing edge knifelike sharp, the inclination of said separating element relative to the perpendicular being adjustable in a manner such that the trimmed central region of said curtain moves downward with laminar flow and with lateral spreading along said inner wall surface and is detached from said inner wall surface at said lower foot end edge and impinges on said substrate with almost the same lateral spreading as produced at said lower foot-end edge, whereby a coating deposited on a substrate by the curtain impinging thereon has formed therein only a naroow marginal bead being at most twice as high as the deposited, still undried coating layer.

2. The apparatus of claim 1, wherein said smooth inner wall surface of said separating element is of shorter length, and the lower foot-end edge thereof hence less distant from said severing edge thereof, than if said separating element were of such length that the central curtain region, flowing downward with the spreading portion thereof remaining laterally in contact with said inner wall surface due to adhesive forces acting between the material of the curtain, on the one hand, and that of the wall surface, on the other hand, would become detached from said inner wall surface as the inherent weight of the central curtain region overcomes said adhesive forces.

3. The apparatus of claim 1, wherein the inclination of said smooth surface of said separating element relative to the perpendicular is adjusted in a manner such that the lower foot-end edge thereof is at a distance of about 3 to 8 mm from the perpendicular, said distance being measured in a plane extending through said lower foot-end edge parallel with said coating plane.

4. The apparatus of claim 1, wherein the inclination of said smooth inner wall surface relative to the perpendicular amounts to from about 3° to 25°.

5. The apparatus of claim 4, wherein said inclination amounts to from 5.5° to 15°.

6. The apparatus of claim 1, wherein the length of said smooth inner wall surface from said upper severing edge to said lower foot-end edge amounts to about 10 to 500 mm.

7. The apparatus of claim 6, wherein said length amounts to from 30 to 70 mm.

8. The apparatus of claim 1, wherein said smooth inner wall surface of said separating element is plated with a layer of noble metal.

9. The apparatus of claim 8, wherein said noble metal is gold.

* * * * *